US010032689B2

(12) United States Patent
Jeon et al.

(10) Patent No.: US 10,032,689 B2
(45) Date of Patent: Jul. 24, 2018

(54) DOUBLE-SIDE COOLING TYPE POWER MODULE AND PRODUCING METHOD THEREOF

(71) Applicant: HYUNDAI MOTOR COMPANY, Seoul (KR)

(72) Inventors: Woo Yong Jeon, Seoul (KR); Hyun Koo Lee, Seoul (KR); Sung Min Park, Seoul (KR); Ki Young Jang, Incheon (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days.

(21) Appl. No.: 15/377,768

(22) Filed: Dec. 13, 2016

(65) Prior Publication Data

US 2018/0102301 A1    Apr. 12, 2018

(30) Foreign Application Priority Data

Oct. 6, 2016  (KR) .................. 10-2016-0129008

(51) Int. Cl.
*H01L 23/367*    (2006.01)
*H01L 23/538*    (2006.01)
(Continued)

(52) U.S. Cl.
CPC ...... *H01L 23/3675* (2013.01); *H01L 23/5386* (2013.01); *H01L 25/0655* (2013.01);
(Continued)

(58) Field of Classification Search
CPC .......................... H01L 25/0655; H01L 25/072
See application file for complete search history.

(56) References Cited

U.S. PATENT DOCUMENTS

2004/0195649 A1* 10/2004 Miura .................. H01L 23/4334
257/529
2008/0054425 A1*  3/2008 Malhan .................. H01L 24/72
257/678
(Continued)

FOREIGN PATENT DOCUMENTS

JP          5374831 B2    12/2013

OTHER PUBLICATIONS

Office Action of corresponding Korean Patent Application No. 10-2016-012900—7 pages, (dated Apr. 19, 2018).

*Primary Examiner* — Bryan Junge
(74) *Attorney, Agent, or Firm* — Knobbe Martens Olson & Bear LLP

(57) ABSTRACT

Disclosed herein are a double-side cooling type power module and a producing method thereof. The double-side cooling type power module includes a pair of semiconductor chips disposed between an upper substrate and a lower substrate. The double-side cooling type power module includes output terminal leads configured to be disposed on a lower surface of the upper substrate and each connected to the pair of semiconductor chips, respectively; a plus terminal lead configured to be disposed at one side of an upper surface of the lower substrate to be connected to any one semiconductor chip selected from the pair of semiconductor chips; and a minus terminal lead configured to be disposed at the other side of the upper surface of the lower substrate to be connected to the other semiconductor chip of the pair of semiconductor chips.

4 Claims, 5 Drawing Sheets

300(310,320)
600(610,620,630,640,650)
700(710,720)

(51) Int. Cl.
*H01L 25/065* (2006.01)
*H01L 25/07* (2006.01)
*H01L 25/00* (2006.01)

(52) U.S. Cl.
CPC ............ *H01L 25/072* (2013.01); *H01L 25/50* (2013.01); *H01L 2224/33* (2013.01)

(56) References Cited

U.S. PATENT DOCUMENTS

| | | | | |
|---|---|---|---|---|
| 2009/0116197 A1* | 5/2009 | Funakoshi | .......... | H01L 21/4882 361/719 |
| 2009/0267215 A1* | 10/2009 | Kitahara | ............. | H01L 23/3735 257/691 |
| 2010/0230800 A1* | 9/2010 | Beaupre | ............. | H01L 23/3735 257/691 |
| 2013/0020694 A1* | 1/2013 | Liang | .................... | H01L 25/072 257/691 |
| 2014/0159216 A1* | 6/2014 | Ishino | ................. | H01L 23/4006 257/675 |
| 2016/0005676 A1* | 1/2016 | Orimoto | ................. | H01L 24/33 257/714 |

\* cited by examiner

[Fig.1]
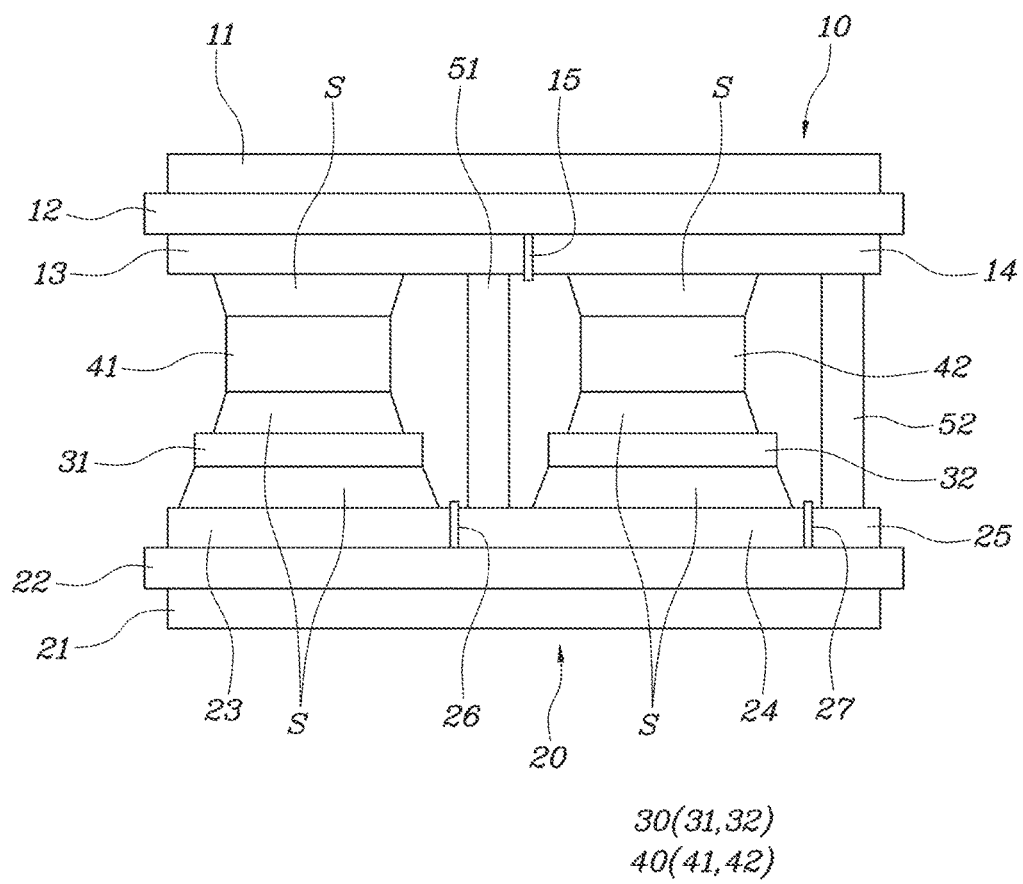

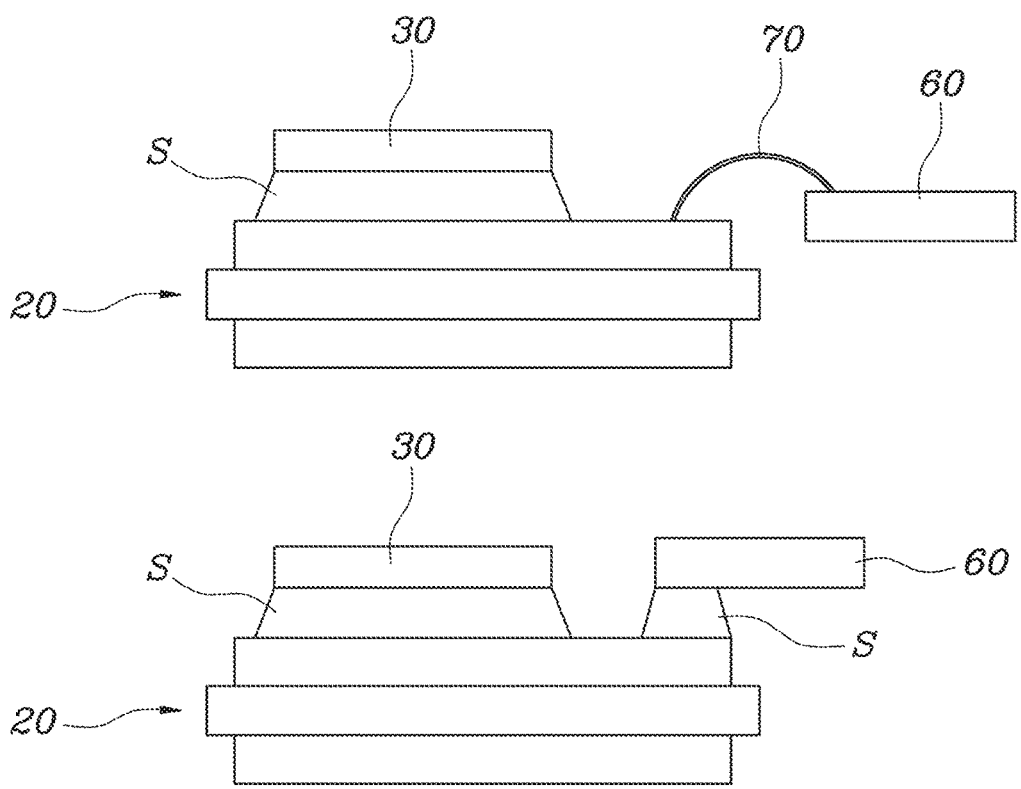
[Fig.2]

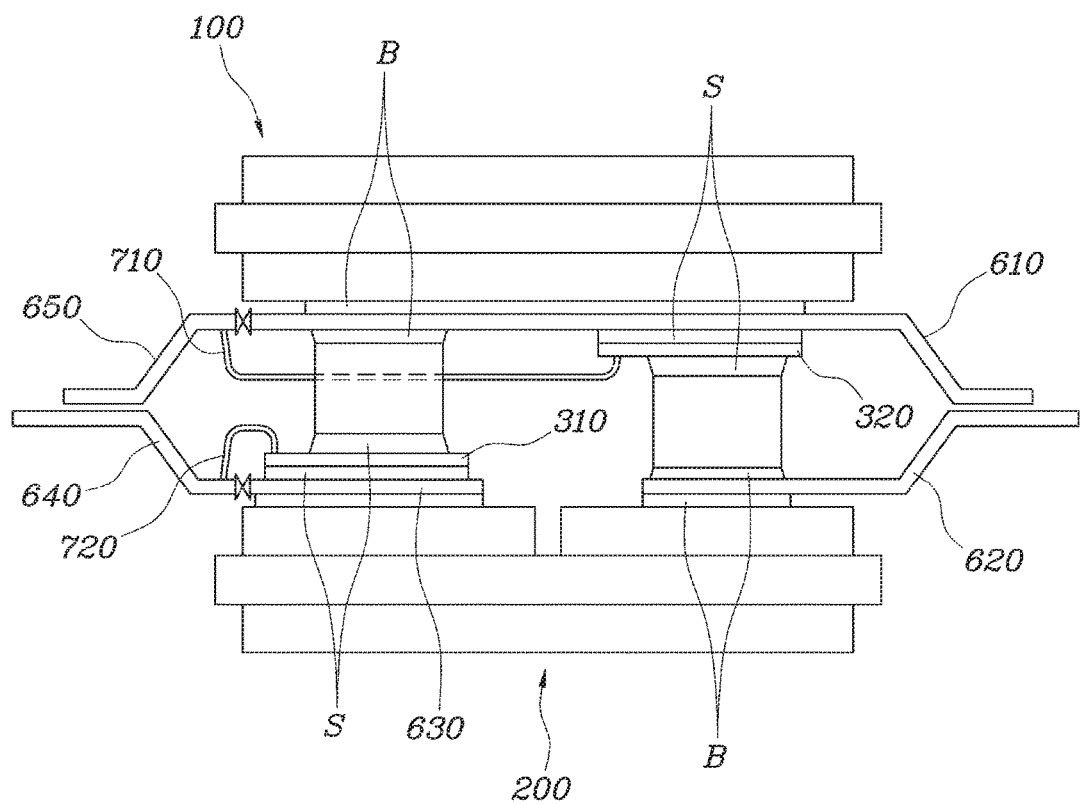
[Fig.3]

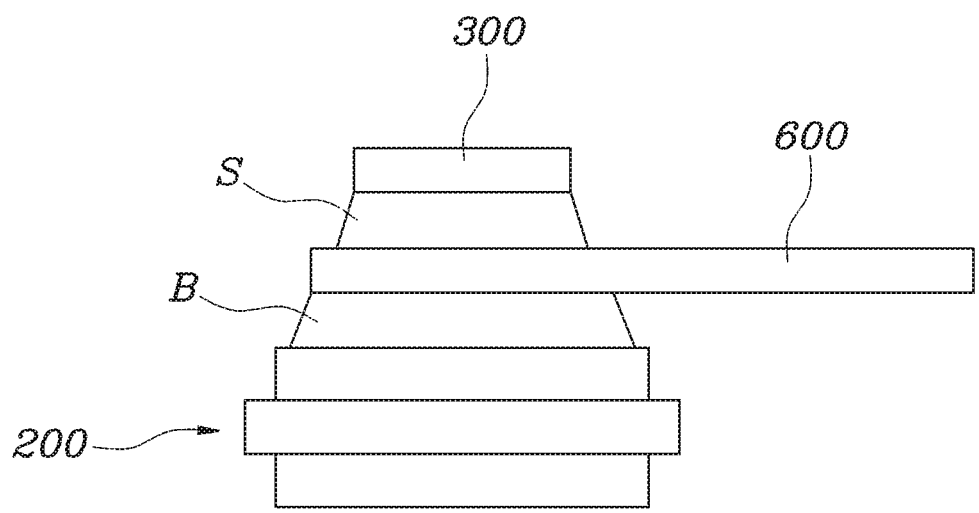
[Fig.4]

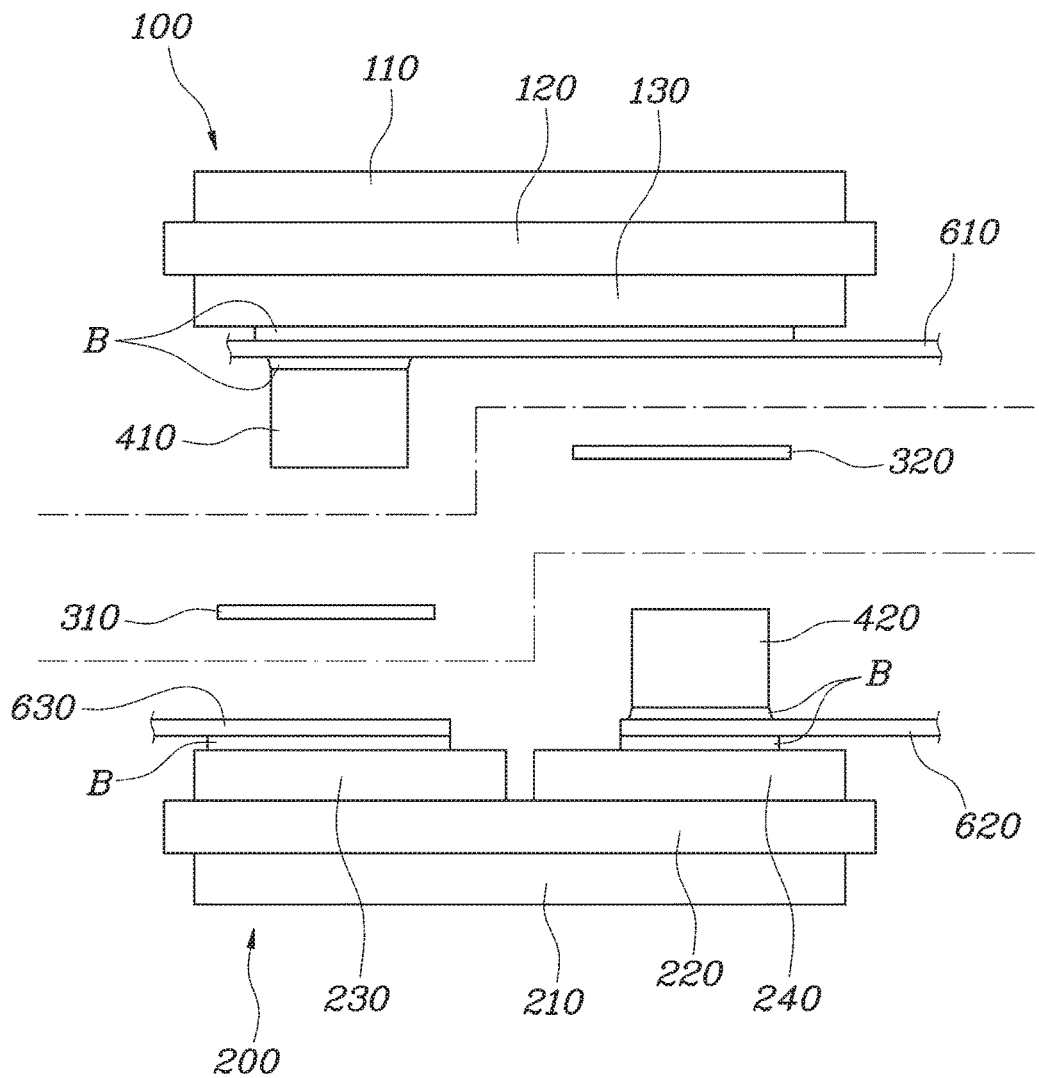
[Fig.5]

DOUBLE-SIDE COOLING TYPE POWER MODULE AND PRODUCING METHOD THEREOF

CROSS REFERENCE TO RELATED APPLICATION

The present application claims priority to Korean Patent Application No. 10-2016-0129008, filed on Oct. 6, 2016, the entire contents of which is incorporated herein for all purposes by this reference.

BACKGROUND

1. Field

The present disclosure relates to a double-side cooling type power module and a producing method thereof, and more particularly, to a double-side cooling type power module having a simpler structure and a smaller volume and a producing method thereof.

2. Description of the Related Art

A power module has been used to supply a high voltage current for driving of a motor of a hybrid vehicle, an electric vehicle, or the like.

In particular, a double-side cooling type power module in which substrates are disposed over upper and lower portions of a semiconductor chip, respectively, and coolers are disposed on outer side surfaces of the substrates, respectively, may have more excellent cooling performance and may be more compactly produced, compared to a general single-side cooling type power module, and therefore the use of the double-side cooling type power module is a growing trend.

The disclosure of this section is to provide background of the present invention. Applicant notes that this section may contain information available before this application. However, by providing this section, Applicant does not admit that any information contained in this section constitutes prior art.

SUMMARY

As illustrated in FIG. 1, a double-side cooling type power module can be produced by sequentially stacking a lower substrate 20, a semiconductor chip 30, and an upper substrate 10, in which since a plus terminal layer 23, minus terminal layers 14 and 25, and output terminal layers 13 and 24 are scattered on the upper substrate 10 and the lower substrate 20, a structure in which conducting lines 51 and 52 for electrically connecting among them are used, insulators 15, 26, and 27 are inserted into the substrates, etc., is complicated.

Further, as illustrated in FIG. 2, a power lead 60 for supplying power to the semiconductor chip 30 and the substrate 20 are electrically connected with each other by a wire 70 or soldering. At this point, an area for the connection of the substrate 20 to the power lead 60 is required, and therefore the size of the power module may be increased.

To prevent the semiconductor chip from being damaged when the respective components are bonded, a soldering bonding scheme is used. This soldering bonding may be separated when excessive heat is applied during a subsequent process including subsequent soldering.

An aspect of the present invention is to provide a double-side cooling type power module capable of being conveniently produced due to a simple structure, being produced with a small volume, and improving bonding reliability, and a producing method thereof.

An other aspect of the present invention is to provide a method for packaging power supply chips of a motor in a hybrid vehicle. When multiple stages of soldering processes are used for producing a single package of power supply chip(s), a soldered bonding may be affected by excessive heat during a subsequent soldering process. In embodiments, a lead (610, 620, 630) of the power supply chip is bonded to a heat dissipation ceramic substrate (100, 200) using a brazing process to form a brazed bonding (B in FIG. 5). Subsequent to the brazing process, the power supply chip (310, 320) is soldered to the lead at a location overlapping the brazed bonding (B) when viewed in a direction perpendicular to a major surface of the substrate to form a soldered boding (S in FIG. 3). In embodiments, no subsequent soldering or heating process is applied after the soldering process to form the soldered boding (S) of the power supply chip.

According to an embodiment of the present invention, there is provided a double-side cooling type power module in which a pair of semiconductor chips are disposed between an upper substrate and a lower substrate, the double-side cooling type power module including: output terminal leads configured to be disposed on a lower surface of the upper substrate and each connected to the pair of semiconductor chips, respectively; a plus terminal lead configured to be disposed at one side of an upper surface of the lower substrate to be connected to any one semiconductor chip selected from the pair of semiconductor chips; and a minus terminal lead configured to be disposed at the other side of the upper surface of the lower substrate to be connected to the other semiconductor chip of the pair of semiconductor chips.

Brazing bonding may be performed between the upper substrate and the output terminal lead, the lower substrate and the plus terminal lead, and the lower substrate and the minus terminal lead, respectively, and soldering bonding may be performed between the semiconductor chip and the output terminal lead, between the semiconductor chip and the plus terminal lead, and between the semiconductor chip and the minus terminal lead.

The lower substrate may include a lower ceramic layer of a ceramic material, a plus terminal layer disposed at one side of an upper surface of the lower ceramic layer to be bonded to the plus terminal lead, and a minus terminal layer disposed at the other side of the upper surface of the lower ceramic layer to be bonded to the minus terminal lead, and the plus terminal layer and the minus terminal layer may be disposed to be insulated from each other.

The double-side cooling type power module may further include: a first signal lead configured to be connected to the first semiconductor chip to transmit and receive a control signal and a second signal lead configured to be connected to the second semiconductor chip to transmit and receive the control signal, in which the semiconductor chip may include a first semiconductor chip disposed between the output terminal lead and the plus terminal lead and a second semiconductor chip disposed between the output terminal lead and the minus terminal lead.

The double-side cooling type power module may further include: a first spacer configured to be disposed between the first semiconductor chip and the output terminal lead and a second spacer configured to be disposed between the second semiconductor chip and the minus terminal lead.

Soldering bonding may be performed between the plus terminal lead and the first semiconductor chip and between the first semiconductor chip and the first spacer, respectively, the soldering bonding may be performed between the output terminal lead and the second semiconductor chip and between the second semiconductor chip and the second spacer, respectively, brazing bonding may be performed between the upper substrate and the output terminal lead and between the output terminal lead and the first spacer, respectively, the brazing bonding may be performed between the lower substrate and the minus terminal lead and between the minus terminal lead and the second spacer, respectively, and the brazing bonding may be performed between the lower substrate and the plus terminal lead.

According to another embodiment of the present invention, there is provided a producing method of a double-side cooling type power module in which a pair of semiconductor chips are disposed between an upper substrate and a lower substrate, the producing method including: an upper module assembling step of disposing an output terminal lead on a lower surface of the upper substrate and disposing a first spacer on a lower surface of the output terminal lead; a lower module assembling step of disposing a plus terminal lead at one side of an upper surface of the lower substrate, disposing a minus terminal lead at the other side of the upper surface of the lower substrate, and disposing a second spacer on the upper surface of the minus terminal lead; and a module coupling step of disposing a first semiconductor chip between the first spacer and the plus terminal lead and disposing a second semiconductor chip between the second spacer and the minus terminal lead to couple between the first semiconductor chip and the second semiconductor chip.

In the upper module assembling step, brazing bonding may be performed between the upper substrate and the output terminal lead and between the output terminal lead and the first spacer, respectively.

In the lower module assembling step, brazing bonding may be performed between the lower substrate and the minus terminal lead, between the minus terminal lead and the second spacer, and between the lower substrate and the plus terminal lead, respectively.

In the module coupling step, soldering bonding may be performed between the plus terminal lead and the first semiconductor chip and between the first semiconductor chip and the first spacer, respectively, and the soldering bonding may be performed between the output terminal lead and the second semiconductor chip and between the second semiconductor chip and the second spacer, respectively.

BRIEF DESCRIPTION OF THE DRAWINGS

FIG. 1 is a diagram illustrating a double-side cooling type power module.

FIG. 2 is a diagram illustrating an appearance in which a lower substrate and a power lead of the double-side cooling type power module are connected to each other.

FIG. 3 is a diagram illustrating an appearance of a double-side cooling type power module according to an embodiment of the present invention.

FIG. 4 is a diagram illustrating an appearance in which a lower substrate and a power lead of the double-side cooling type power module according to an embodiment of the present invention are connected to each other.

FIG. 5 is a diagram illustrating an intermediate assembly appearance of the double-side cooling type power module produced according to an embodiment of the present invention.

DESCRIPTION OF EMBODIMENTS

Terminologies used herein are to explain embodiments of the present invention, and are not to limit the present invention. Singular forms used herein include plural forms as long as phrases do not clearly indicate an opposite meaning. A term "including" used in the present specification concretely indicates specific properties, regions, integer numbers, steps, operations, elements, and/or components, and is not to exclude presence or addition of other properties, regions, integer numbers, steps, operations, elements, components, and/or a group thereof.

All terms including technical terms and scientific terms used herein have the same meaning as the meaning generally understood by those skilled in the art to which the present invention pertains unless defined otherwise. Terms defined in a generally used dictionary are additionally interpreted as having the meaning matched to the related art document and the currently disclosed contents and are not interpreted as ideal or formal meaning unless defined.

Hereinafter, a double-side cooling type power module and a producing method thereof according to embodiments of the present invention will be described with reference to the accompanying drawings.

As illustrated in FIGS. 3 and 4, a double-side cooling type power module according to an embodiment of the present invention is configured to include a structure in which a pair of semiconductor chips 300 are disposed in parallel between an upper substrate 100 and a lower substrate 200, an output terminal lead 610 disposed between the upper substrate 100 and the semiconductor chip 300, a plus terminal lead 620 disposed between one side of the lower substrate 200 and the semiconductor chip 300, and a minus terminal lead 630 disposed between the other side of the lower substrate 200 and the semiconductor chip 300.

In FIG. 1, element 60 which may correspond to the foregoing output terminal lead 610, plus terminal lead 620, and minus terminal lead 630 are separately bonded to the upper substrate 100 or the lower substrate 200 by a wire or soldering, but according to an embodiment of the present invention, these parts are disposed between the semiconductor chip 300 and the upper and lower substrates to reduce an area of the upper and lower substrates.

In this case, the pair of semiconductor chips 300 may further include a first semiconductor chip 310 connected to the minus terminal lead 630 and a second semiconductor chip 320 connected to the plus terminal lead 620, a first signal lead 640 connected to the first semiconductor chip 310 to transmit and receive a signal, and a second signal lead 650 connected to the second semiconductor chip 320 to transmit and receive a signal.

In addition thereto, to secure a disposition space of a first wire 720 connecting between the first semiconductor chip 310 and the first signal lead 640, a first spacer 410 may be disposed. Similarly, to secure a disposition space of a second wire 710 connecting between the second semiconductor chip 320 and the second signal lead 650, a second spacer 420 may be disposed.

Hereinafter, for convenience of explanation, the stacking structure in which the upper substrate 100, the output terminal lead 610, the first spacer 410, the first semiconductor chip 310, the minus terminal lead 630, and the lower substrate 200 succeed is called a first switch and the stacking structure in which the upper substrate 100, the output terminal lead 610, the second semiconductor chip 320, the second spacer 420, the plus terminal lead 620, and the lower substrate 200 succeed is called a second switch.

The first switch and the second switch have a difference in that the disposition directions of the semiconductor chip 300 and the spacer 400 are opposite to each other, which input terminals, that is, the plus terminal lead 620 and the minus terminal lead 630 are disposed in one direction and an output terminal, that is, the output terminal lead 610 is disposed in the other direction to simplify the structure of the upper and lower substrates.

That is, the double-side cooling type power module has a problem in that the input terminal and the output terminal are scattered on the upper and lower substrates, and therefore the structure thereof is complicated and the producing process such as disposing the separate conducting line for electrically connecting them is complicated, but the structure of the double-side cooling type power module may be more simplified only by making the disposition direction of the pair of semiconductor chips 300 be opposite to each other.

Describing in more detail the upper and lower substrates, it can be appreciated that the upper and lower substrates are divided into three layers. That is, the upper substrate 100 is configured to include an upper heat dissipation layer 110 of an outside thereof, an upper ceramic layer 120 of a central portion thereof, and an output terminal layer 130 of an inside thereof and the lower substrate 200 is configured to include a lower heat dissipation layer 210 of an outside thereof, a lower ceramic layer 220 of a central portion thereof, and a plus terminal layer 230 and a minus terminal layer 240 of an inside thereof.

In this case, the plus terminal layer 230 is bonded to the plus terminal lead 620, the minus terminal layer 240 is bonded to the minus terminal lead 630, and the plus terminal layer 230 and the plus terminal lead 620 are preferably disposed to be insulated from the minus terminal layer 240 and the minus terminal lead 630.

That is, a separate insulator is inserted between the plus terminal layer 230 and the plus terminal lead 630 and between the minus terminal layer 240 and the minus terminal lead 630 or these parts are disposed to be spaced apart from each other and then may be insulated by an encapsulant.

However, as the output terminal lead 610, the plus terminal lead 620, and the minus terminal lead 630 are incorporated into the stacking structure, the number of layers is more increased than the double-side cooling type power module, such that the bonding reliability may be reduced only due to the soldering bonding.

Therefore, the bonding of the rest portions other than the bonding of the semiconductor chip 300 vulnerable to heat preferably suffers from the brazing bonding.

That is, the brazing bonding B is preformed between the output terminal layer 130 of the upper substrate 100 and the output terminal lead 610, between the output terminal lead 610 and the first spacer 410, between the plus terminal layer 230 of the lower substrate 200 and the plus terminal lead 620, between the minus terminal layer 240 of the lower substrate 200 and the minus terminal lead 630, and between the minus terminal lead 630 and the second spacer 420, thereby obtaining the high bonding strength.

Next, soldering bonding S is performed when the first semiconductor chip 310 bonded to the first spacer 410 and the minus terminal lead 630, and the second semiconductor chip 320 bonded to the second spacer 420 and the output terminal lead 610 like before.

The brazing bonding is performed at a temperature of about 450° C. or more, for example, a temperature of about 800° C. when using an adhesive of, for example, Ag—Sn, and therefore the brazing bonding part may not be weakened at the time of performing the soldering bonding performed at a temperature of about 300° C.

Meanwhile, a producing method of a double-side cooling type power module according to an embodiment of the present invention is configured to include an upper module assembling step, a lower module assembling step, and a module coupling step.

At this point, an appearance in which the upper module assembling step and the lower module assembling step end, and then the semiconductor chip 300 is disposed in the module coupling step is illustrated in FIG. 5.

In the upper module assembling step, the output terminal lead 610 is disposed on a lower surface of the upper substrate 100 and the first spacer 410 is disposed on a lower surface of the output terminal lead 610. At this point, the respective components suffer from the brazing bonding.

In the lower module assembling step, the plus terminal lead 620 is disposed at one side of the upper surface of the lower substrate 200, the minus terminal lead 630 is disposed at the other side thereof, and the second spacer 420 is disposed on the plus terminal lead 620. At this point, the respective components suffer from the brazing bonding.

Next, in the module coupling step, the first semiconductor chip 310 and the second semiconductor chip 320 are disposed between the components assembled in the upper module assembling step and the lower module assembling step and then suffer the soldering bonding.

The double-side cooling type power module and a producing method thereof according to an embodiment of the present invention have the following effects.

First, it is possible to provide the power module having the simpler structure by the chip disposition having the top-bottom turning structure.

Second, it is possible to simplify the producing process by simplifying the structure of the power module.

Third, it is possible to reduce the overall volume of the power module by deleting the bonded portion between the substrate and the power lead.

Fourth, it is possible to improve the bonding strength of the stacking structure of the power module by applying the brazing bonding scheme.

Although embodiments of the present invention have been described with reference to the accompanying drawings, those skilled in the art will appreciate that various modifications and alterations may be made.

It is to be understood that the scope of the present invention will be defined by the claims rather than the above-mentioned description and all modifications and alternations derived from the claims and their equivalents are included in the scope of the present invention.

What is claimed is:

1. A power module comprising:
   an upper substrate;
   a lower substrate;
   a first semiconductor chip and a second semiconductor chip disposed between the upper substrate and the lower substrate;
   an output terminal lead disposed under a lower surface of the upper substrate, wherein the first and second semiconductor chips are electrically connected to the output terminal lead;
   a first polarity terminal lead disposed over an upper surface of the lower substrate and electrically connected to the first semiconductor chip; and a second polarity terminal lead disposed over the upper surface of the lower substrate and electrically connected to the second semiconductor chip, a first spacer formed between the first semiconductor chip and the output terminal lead such that the upper substrate, the output terminal lead, the first spacer, the first semiconductor chip, the first polarity terminal lead and the lower substrate are arranged in order, wherein the first spacer is braze-bonded to the output terminal lead whereas the first spacer is solder-bonded to the first semiconductor chip; and a second spacer formed between the second semiconductor chip and the second polarity terminal lead such that the upper substrate, the output terminal lead, the second semiconductor chip, the second spacer and the second polarity terminal lead and the lower substrate are arranged in order, wherein the second spacer is braze-bonded to the second polarity terminal lead whereas the second spacer is solder-bonded to the second semiconductor chip.

2. The power module of claim 1, wherein the lower substrate includes a ceramic layer, a first polarity terminal layer disposed over the ceramic layer and bonded to the first polarity terminal lead, and a second polarity terminal layer disposed over the ceramic layer and bonded to the second polarity terminal lead, and wherein the first polarity terminal layer and the second polarity terminal layer are insulated from each other.

3. The power module of claim 2, wherein the first polarity terminal layer is braze-bonded to the first polarity terminal lead, and wherein the second polarity terminal layer is braze-bonded to the second polarity terminal lead.

4. The power module of claim 1, further comprising:

a plurality of signal leads connected to the first semiconductor chip and the second semiconductor chip and configured to transmit and receive control signals.

* * * * *